(12) United States Patent
Murari et al.

(10) Patent No.: US 7,138,875 B2
(45) Date of Patent: Nov. 21, 2006

(54) CASCODED POWER AMPLIFIER, PARTICULARLY FOR USE IN RADIO FREQUENCY

(75) Inventors: Bruno Murari, Monza (IT); Alessandro Moscatelli, Como (IT); Lorenzo Labate, Albairate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1 day.

(21) Appl. No.: 10/723,705

(22) Filed: Nov. 26, 2003

(65) Prior Publication Data
US 2004/0104777 A1    Jun. 3, 2004

(30) Foreign Application Priority Data
Nov. 28, 2002  (EP) .................................. 02425729

(51) Int. Cl.
*H03F 3/04* (2006.01)
(52) U.S. Cl. .................. 330/311; 330/277; 330/300
(58) Field of Classification Search ................ 330/311, 330/277, 300
See application file for complete search history.

(56) References Cited

U.S. PATENT DOCUMENTS

| 3,449,683 | A | * | 6/1969 | Gane ........................ 330/277 |
| 4,241,316 | A | * | 12/1980 | Knapp ........................ 330/277 |
| 5,463,347 | A | | 10/1995 | Jones et al. ................. 330/253 |
| 5,508,570 | A | * | 4/1996 | Laber et al. ................. 327/563 |
| 6,002,299 | A | * | 12/1999 | Thomsen ........................ 330/9 |
| 6,346,856 | B1 | * | 2/2002 | Myers et al. ............... 330/252 |
| 6,353,345 | B1 | * | 3/2002 | Yushan et al. .............. 327/112 |
| 6,456,159 | B1 | * | 9/2002 | Brewer .......................... 330/9 |

FOREIGN PATENT DOCUMENTS

| DE | 101 14 935 | 10/2002 |
| EP | 0 657 995 | 6/1995 |
| EP | 0 790 703 | 8/1997 |

OTHER PUBLICATIONS

Hong, Merit Y., "Simulation and Fabrication of Submicron Channel Length DMOS Transistors for Analog Applications," *IEEE Transactions of Electron Devices*, 40(12):2222-2230, Dec. 1993.

* cited by examiner

*Primary Examiner*—Patricia Nguyen
(74) *Attorney, Agent, or Firm*—Lisa K. Jorgenson; Dennis M. de Guzman; Seed IP Law Group PLLC

(57) ABSTRACT

A power amplifier comprising at least a load element and at least an active element inserted, in series to each other, between a first and a second voltage reference is described. Advantageously, according to an embodiment of the invention, the load element comprises a DMOS transistor.

19 Claims, 1 Drawing Sheet

CASCODED POWER AMPLIFIER, PARTICULARLY FOR USE IN RADIO FREQUENCY

BACKGROUND OF THE INVENTION

1. Field of the Invention

The present disclosure generally relates to a cascoded power amplifier, particularly but not exclusively for use in radio frequency applications.

More specifically but not exclusively, the disclosure relates to a power amplifier comprising at least a load element and at least an active element inserted, in series to each other, between a first and a second voltage reference.

The disclosure relates particularly, but not exclusively, to a power amplifier for radio frequency applications and the following description is made with reference to this field of application for convenience of illustration only.

2. Description of the Related Art

As it is well known, radio frequency power amplifiers, or RF amplifiers, require high cut off frequencies as well as high breakdown voltage values in order to be able to provide high powers at high frequencies.

Moreover, low feedback capacitance values, high transconductance values and low on-state resistance values are required.

Generally, some of these features are available in the VLSI CMOS BiCMOS and BCD standard silicon technologies. However, devices produced according to these technologies having all the above features simultaneously do not exist.

In particular, LDMOS devices ensure high breakdown voltage values as well as high power values, but they have degraded radio frequency performances.

On the contrary, VLSI CMOS devices, particularly transistors with short gate length, have a high transconductance, high frequency response and low on-state resistance, but a low breakdown voltage value.

BRIEF SUMMARY OF THE INVENTION

One embodiment of the invention uses a DMOS transistor and a CMOS transistor being conveniently connected in cascode configuration so as to obtain a power amplifier having optimum characteristics in radio frequency applications.

The features and advantages of the power amplifier according to the invention will be apparent from the following description of an embodiment thereof given by way of non-limiting example with reference to the attached drawing.

DETAILED DESCRIPTION OF THE INVENTION

Figure 1:
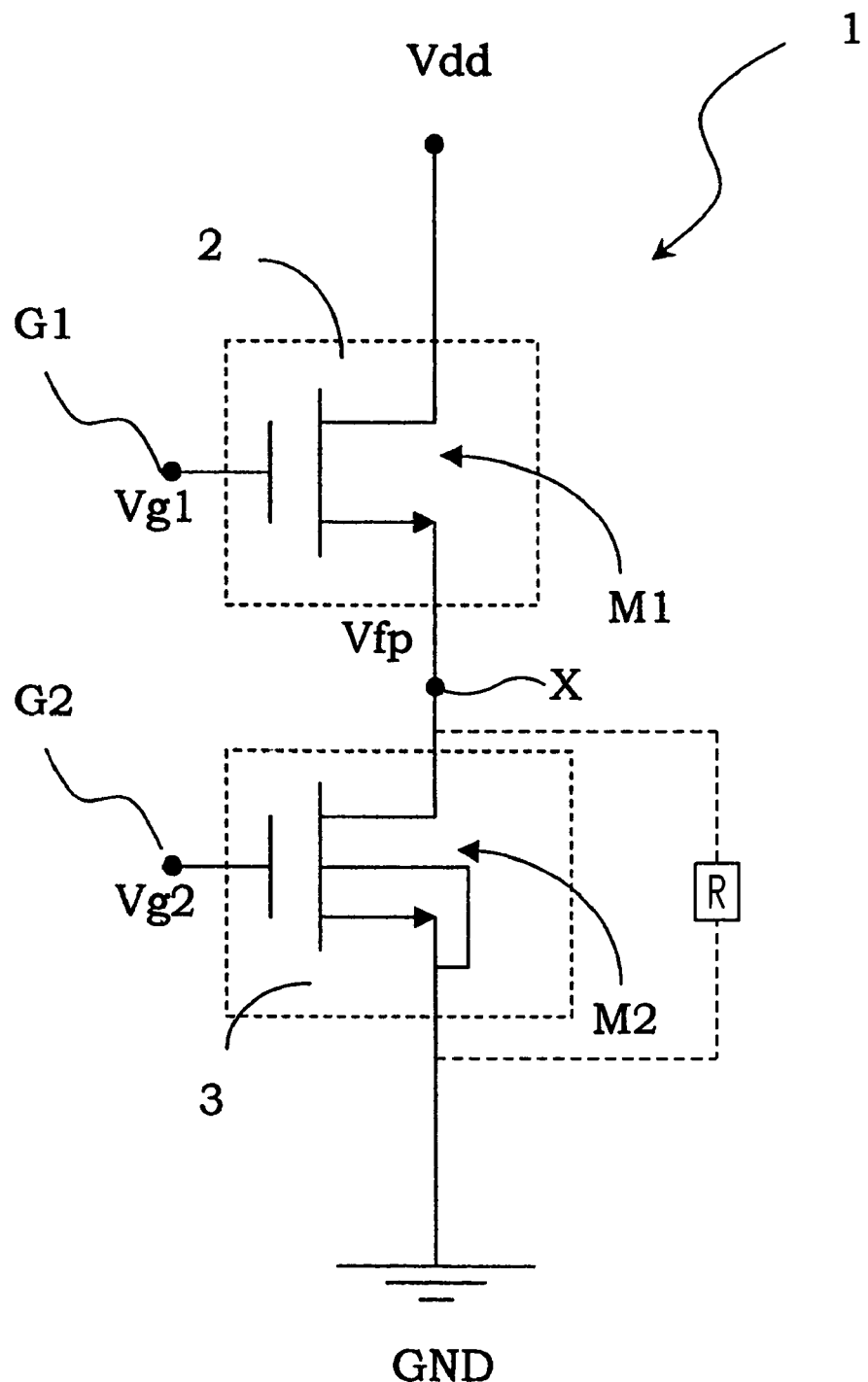
FIG. 1 shows a power amplifier according to an embodiment of the invention.

Embodiments of a cascoded power amplifier, particularly for use in radio frequency, are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The technical problem underlying an embodiment of the present invention is to provide a power amplifier, having such structural and functional characteristics so as to allow high cut off frequencies, high breakdown voltage value, high transconductance values and low on-state resistance values to be obtained, thus overcoming the limits still affecting at present the devices according to the prior art and allowing a right use thereof for radio frequency applications.

With reference to the sole drawing of FIG. 1, a power amplifier according to one embodiment of the invention is globally and schematically indicated with 1.

The power amplifier 1 comprises a load element 2 and an active element 3, inserted in series to each other between a first voltage reference, in particular the supply voltage Vdd, and a second voltage reference, in particular the ground GND.

The load element 2 and the active element 3 are connected to each other to define a circuit node X which can also serve as an additional output terminal of the power amplifier 1. The main output terminal is node Vdd.

In the example shown in the figure, the load element 2 comprises a DMOS transistor M1 having a gate terminal G1 receiving a first control voltage Vg1.

On the contrary, the active element 3 comprises a VLSI CMOS transistor M2 having a gate terminal G2 receiving a second control voltage Vg2. A high frequency bipolar transistor could also be used.

Advantageously, according to an embodiment of the invention, once the integration limits of the transistor M2 are fixed, the transistor M1 is sized and biased in order to optimize the cascode configuration performances of the power amplifier 1, the power consumption and the reliability.

In particular, a value of the second control voltage Vg2 is set and the integration limits of the transistor M1 are fixed in order to allow the transistor M2 to work in saturation area. In this way, the power amplifier 1 has in fact a high cut off frequency as well as a high transconductance value. In the linear area, a low activation resistance value is obtained.

It is worth noting that, advantageously, according to an embodiment of the invention, the transistor M2, working in saturation area, limits the peak voltage value in correspondence with the circuit node X to the gate-drain value that said transistor M2 can afford, i.e.:

$$Vx \geq (Vg2 - V_{th2})$$

being:

Vx the voltage on the circuit node X;

Vg2 the voltage applied to the gate terminal G2 of the transistor M2; and

Vth2 the threshold voltage of the transistor M2.

In an alternative embodiment, a resistive element R (shown in broken lines) is connected between the drain and source terminals of the transistor M2 so as to ensure the right stabilization of the circuit node X.

Direct current and alternating current simulations performed by the Applicant between an amplifier realized according to an embodiment of the invention by means of a DMOS transistor and a cascode configuration VLSI CMOS transistor and an amplifier realized according to the prior art by means of a LDMOS transistor alone have shown the following performance improvements (to be considered only as indicative):

cut off frequency increase by more than 185%;
decrease by 50% in the product of the activation resistance and the CMOS channel length (Ron*W);
early voltage (Vearly) huge increase by about 30 times;
transconductance (gm*W) increase by 150%;
feedback capacitance value (Cgd) decrease by 95%;
breakdown voltage increase. The power amplifier 1 failure is generally equal or higher than the transistor M1 (load) failure and it is certainly higher than the transistor M2 (active element) failure.

Moreover it must be noticed that the cascode configuration power amplifier 1 according to one embodiment of the invention provides an area occupation depending on the sizing methodology applied. For example, the optimization of the knee current cascode amplifier can provide an area consumption corresponding to about 2–2.5 times an amplifier realized by means of a single DMOS transistor, with a corresponding increase in the output capacity being almost doubled.

In conclusion, the cascoded power amplifier according to one embodiment of the invention has high cut off frequencies, high breakdown voltage values and high transconductance values in saturated area and low on-state resistance value, being therefore particularly suitable for radio frequency applications.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A power amplifier, comprising:
   at least a load element and at least an active element inserted, in series to each other, between first and second voltage references, wherein said load element includes a DMOS transistor; and
   a resistive element, inserted between a circuit node connecting said active element to said load element and said second voltage reference, to stabilize the circuit node.

2. The power amplifier according to claim 1 wherein said active element comprises a VLSI CMOS transistor.

3. The power amplifier according to claim 1 wherein said active element comprises a high frequency bipolar transistor.

4. The power amplifier according to claim 2 wherein said DMOS transistor is sized and biased so that the VLSI CMOS transistor works in saturation area and complies with a relation:

$$Vx \geq (Vg2 - V_{th2})$$

wherein:
Vx is a voltage value on a terminal of said VLSI CMOS transistor;
Vg2 is a voltage value on a control terminal of said VLSI CMOS transistor; and
Vth2 is a threshold voltage value of said VLSI CMOS transistor.

5. The power amplifier according to claim 1 wherein said load element has a control terminal to receive a first control voltage being set so that the active element works in a saturation area.

6. An apparatus, comprising:
   a load element having a first terminal coupled to a first voltage reference, a second terminal coupled to receive a first control voltage, and a third terminal coupled to a node; and
   an active element in cascode configuration and having a first terminal coupled to the third terminal of the load element at the node, a second terminal coupled to receive a second control voltage, and a third terminal coupled to a second voltage reference; and
   a resistive element coupled between the first and third terminals of the active element to stabilize the node at the first terminal of the active element,
   wherein the second control voltage is set and integration limits of the load element are fixed to allow the active element to operate in a saturation area to provide high cutoff frequency and a high transconductance value and in a linear area to prove low activation resistance.

7. The apparatus of claim 6 wherein the load element comprises a DMOS transistor.

8. The apparatus of claim 6 wherein the active element comprises a VLSI CMOS transistor.

9. The apparatus of claim 6 wherein the active element comprises a bipolar transistor.

10. The apparatus of claim 6 wherein the load element and the active element are coupled to provide a high breakdown voltage in the saturation area.

11. A power amplifier usable in radio frequency applications, the power amplifier comprising:
    first and second voltage references;
    a transistor load element having a first terminal coupled to the first voltage reference, a second terminal coupled to receive a first control voltage, and a third terminal coupled to a node;
    an active element in cascode configuration and having a first terminal coupled to the third terminal of the transistor load element at the node, a second terminal coupled to a second control voltage, and a third terminal coupled to the second voltage reference, wherein the transistor load element is sized and biased and the second control voltage is set to allow the active element to operate in a saturation area to provide high cutoff frequency and a high transconductance value and in a linear area to prove low activation resistance; and
    a resistive element to stabilize the node and coupled between the first and third terminals of the active element in a manner that a first terminal of the resistive element is coupled to the node and a second terminal of the resistive element is coupled to the second voltage reference.

12. The power amplifier of claim 11 Wherein the transistor load element and the active element are coupled to provide a high breakdown voltage in the saturation area.

13. The power amplifier of claim 11 wherein the transistor load element comprises a DMOS transistor.

14. The power amplifier of claim 11 wherein the active element comprises either a VLSI CMOS transistor or a bipolar transistor.

15. A method, comprising:
   sizing and biasing a transistor load element to allow an active element to operate in a saturation area;
   receiving a first control voltage at a control terminal of the load element to allow the active element to operate in the saturation area;
   setting a second control voltage at a control terminal of the active element to allow the active element to operate in the saturation area; and
   obtaining high cutoff frequencies and high transconductance values in the saturation area, and obtaining low on-state resistance values in a linear area of operation; and
   stabilizing a circuit node between the transistor load element and the active element with a resistive element having a first terminal coupled to the circuit node and a second terminal coupled to a voltage reference.

16. The method of claim 15, further comprising obtaining high breakdown voltage values in the saturation area.

17. An apparatus, comprising:
   means for sizing and biasing a transistor load element to allow an active element to operate in a saturation area;
   means for receiving a first control voltage at a control terminal of the load element to allow the active element to operate in the saturation area;
   means for setting a second control voltage at a control terminal of the active element to allow the active element to operate in the saturation area; and
   means for obtaining high cutoff frequencies and high transconductance values in the saturation area, and for obtaining low on-state resistance values in a linear area of operation; and
   means for stabilizing a circuit node between the transistor load element and the active element, the means for stabilizing being coupled between a pair of terminals of the active element that are different from the control terminal of the active element.

18. The apparatus of claim, 17 further comprising a means for obtaining high breakdown voltage values in the saturation area.

19. The apparatus of claim 17 wherein the means for stabilizing the circuit node comprises a resistive element.

* * * * *